(12) United States Patent
Chieh et al.

(10) Patent No.: US 9,831,933 B1
(45) Date of Patent: Nov. 28, 2017

(54) TECHNIQUES AND METHODS FOR FREQUENCY DIVISION MULTIPLEXED DIGITAL BEAMFORMING

(71) Applicant: The United States of America as represented by the Secretary of the Navy, Washington, DC (US)

(72) Inventors: Jia-Chi Samuel Chieh, San Diego, CA (US); Aaron Clawson, San Diego, CA (US); Mike Civerolo, San Diego, CA (US); Jeanne Quimby, San Diego, CA (US); John D. Rockway, San Diego, CA (US); John W. Rockway, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 15/233,688

(22) Filed: Aug. 10, 2016

(51) Int. Cl.
*H04B 7/06* (2006.01)
*H03M 1/12* (2006.01)
*H03M 1/66* (2006.01)
*H04L 5/00* (2006.01)

(52) U.S. Cl.
CPC ............ *H04B 7/0617* (2013.01); *H03M 1/12* (2013.01); *H03M 1/66* (2013.01); *H04L 5/0005* (2013.01)

(58) Field of Classification Search
CPC ........ H03M 1/12; H03M 1/122; H03M 1/125; H03M 1/66; H03M 1/661; H03M 3/466; H03M 3/47; H03M 3/472; H03M 3/474; H04B 7/0617; H04B 7/068; H04B 7/0682; H04B 7/0695; H04B 7/0697; H04B 7/0871; H04B 7/0874; H04B 7/0891; H04B 7/0897; H04L 5/0005; H04J 2011/0013; H04J 11/003; H04J 11/0053; H04J 11/0063
USPC ........ 375/260–262, 265, 267, 297–299, 308, 375/329, 332; 329/300, 304, 316, 345, 329/348; 332/103, 144, 151
See application file for complete search history.

(56) References Cited

U.S. PATENT DOCUMENTS

| | | |
|---|---|---|
| 4,965,602 A | 10/1990 | Kahrilas et al. |
| 5,461,389 A | 10/1995 | Dean |
| 5,682,376 A | 10/1997 | Hayashino et al. |
| 6,411,653 B1 * | 6/2002 | Arunachalam ...... H04B 1/0021 348/395.1 |

(Continued)

*Primary Examiner* — Young T Tse
(74) *Attorney, Agent, or Firm* — SPAWAR Systems Center Pacific; Kyle Eppele (57) ABSTRACT

A system includes a first low noise amplifier, a second low noise amplifier, a local analog oscillator signal, a signal splitter, a mixer, a mixer, an analog to digital converter and a digital channelizer. The first low noise amplifier outputs a first amplified analog signal based on a received analog antenna signal at a time $t_0$. The second low noise amplifier outputs a second amplified analog signal based on the received analog antenna signal at a time $t_1$. The local analog oscillator signal outputs a local analog oscillator signal. The signal splitter outputs a split analog oscillator signal and a split analog oscillator signal. The mixer outputs a first mixed signal. The mixer outputs a second mixed signal. The analog to digital converter outputs a combined digital signal. The digital channelizer outputs a received signal based on the combined digital signal.

4 Claims, 6 Drawing Sheets

(56) References Cited

U.S. PATENT DOCUMENTS

| | | | |
|---|---|---|---|
| 7,394,424 B1 | 7/2008 | Jelinek et al. | |
| 7,474,262 B2 | 1/2009 | Alland | |
| 8,988,278 B2 | 3/2015 | Lee et al. | |
| 2004/0087294 A1* | 5/2004 | Wang | H04B 7/086 455/276.1 |
| 2005/0192058 A1* | 9/2005 | Jung | H04W 16/28 455/562.1 |
| 2005/0238116 A1* | 10/2005 | Monta | H04L 5/06 375/298 |
| 2006/0072629 A1* | 4/2006 | Kent | H04B 7/0848 370/516 |
| 2009/0054012 A1* | 2/2009 | Lin | H04B 1/0483 455/93 |
| 2013/0165059 A1* | 6/2013 | Son | H04B 7/0848 455/101 |
| 2014/0169501 A1* | 6/2014 | Nazarathy | H03H 17/0266 375/316 |

* cited by examiner

FIG. 1

PRIOR ART

FIG. 2

PRIOR ART

TECHNIQUES AND METHODS FOR FREQUENCY DIVISION MULTIPLEXED DIGITAL BEAMFORMING

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619)553-5118; email: ssc_pac_t2@navy.mil. Reference Navy Case No. 102,593.

BACKGROUND OF THE INVENTION

Embodiments of the invention relate to digital beamforming antenna arrays.

In current digital beamforming (DBF) implementations to date, each channel of a phased array antenna (PAA) requires one individual analog-to-digital converter (ADC). ADCs are complex circuits that can consume processing resources as well as power and space. For example, using the traditional DBF approach, a 10,000 element PAA would require 10,000 ADCs. Although possible, this method would be inefficient in terms of power consumed and dissipated. However, if one ADC could support a plurality of channels, then the total ADC count would be reduced dramatically. This would reduce the overall size and weight of the required circuitry as well as the total consumed power. This feature alone would make DBF an attractive alternative to analog methods. The current invention illustrates methods and architectures which would enable the reduction of the total number of ADCs. It also illustrates a methods and architecture for beamforming that saves processing resources by channelizing the spectrum of a combined digital signal from a single ADC.

SUMMARY OF THE INVENTION

An aspect of the present invention is drawn to a system that includes a first low noise amplifier, a second low noise amplifier, a local analog oscillator signal, a signal splitter, a mixer, a mixer, an analog to digital converter and a digital channelizer. The first low noise amplifier outputs a first amplified analog signal based on a received analog antenna signal at a time $t_0$. The second low noise amplifier outputs a second amplified analog signal based on the received analog antenna signal at a time $t_1$. The local analog oscillator signal outputs a local analog oscillator signal. The signal splitter outputs a split analog oscillator signal and a split analog oscillator signal, the split analog oscillator signal being based on the local analog oscillator signal, the split analog oscillator signal being based on the local analog oscillator signal and being different from the split analog oscillator signal. The mixer outputs a first mixed signal based on the first amplified analog signal and the split analog oscillator signal. The mixer outputs a second mixed signal based on the second amplified analog signal and the split analog oscillator signal. The analog to digital converter outputs a combined digital signal based on the first mixed signal and the second mixed signal. The digital channelizer outputs a received signal based on the combined digital signal.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

In a digital system for PAA beamforming, the ability to distinguish between antenna element channels is necessary in order to preserve the phase information of each antenna element. This is because different complex phasing weights are applied to the phase information of each channel in order to form (steer) the beam-formed antenna beam. In traditional receiving DBF architecture, each received signal from an antenna element is down-converted to an identical intermediate frequency (IF) and physically isolated from the other channels by using a different ADC for each antenna element channel. Each channel is down-converted because a typical ADC is unable to sample at a high enough rate to represent RF/microwave frequencies. The digital signal output from each ADC is then beam-formed using a DSP processor to apply a unique complex DBF weight to each channel and to combine (sum) the channels. The combined signal output from the DSP is then up-converted to RF and the output is the desired beam-formed received antenna beam. In traditional antenna transmitting DBF architecture, each channel requires a separate digital to analog converter (DAC) in order to preserve the weighted phase information of the beam-formed signal to be transmitted by the antenna elements.

Prior art beamforming architectures will now be described with reference to FIGS. 1-4.

One type of beamforming architecture works in the analog domain. This will now be described with reference to FIGS. 1-2.

Figure 1:
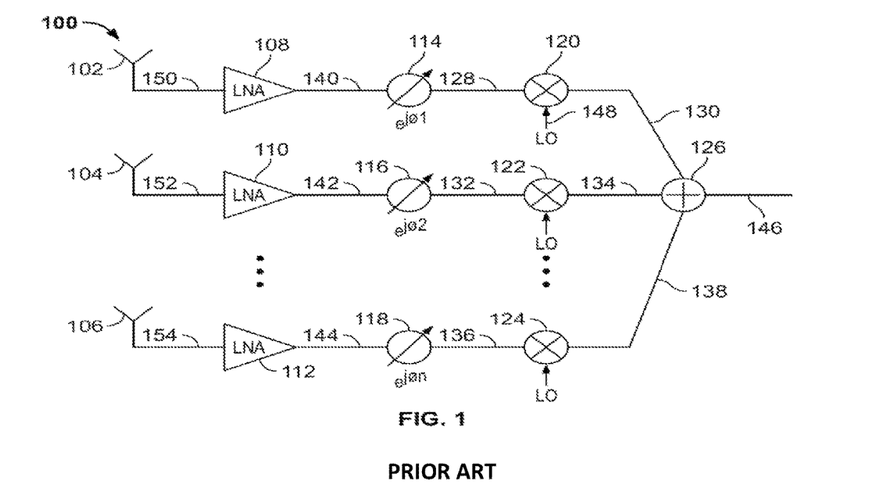
FIG. 1 illustrates a prior art RF analog beamforming architecture using in-line phase shifting architecture.

FIG. 1 illustrates a prior art RF analog beamforming architecture 100 using in-line phase shifting architecture.

As shown in the figure, prior art RF analog beamforming architecture 100 includes an antenna element 102, an antenna element 104, an antenna element 106, a low noise amplifier (LNA) 108, a LNA 110, a LNA 112, a phase shifter 114, a phase shifter 116, a phase shifter 118, a mixer 120, a mixer 122, a mixer 124 and a combiner 126.

LNA 108 is arranged to receive an analog antenna signal 150 from antenna element 102 and output an amplified analog signal 140. LNA 110 is arranged to receive an analog antenna signal 152 from antenna element 104 and output an amplified analog signal 142. LNA 112 is arranged to receive an analog antenna signal 154 from antenna element 106 and output an amplified analog signal 144.

Phase shifter 114 is arranged to receive amplified analog signal 140 and output a phase shifted analog signal 128. Phase shifter 116 is arranged to receive amplified analog signal 142 and output a phase shifted analog signal 132. Phase shifter 118 is arranged to receive amplified analog signal 144 and output a phase shifted analog signal 136.

Mixer 120 is arranged to receive phase shifted analog signal 128 at the RF port and a local analog oscillator signal 148 at the LO port. Mixer 120 is further arranged to output a mixed analog signal 130. Mixer 122 is arranged to receive phase shifted analog signal 132 at the RF port and local analog oscillator signal 148 at the LO port. Mixer 122 is further arranged to output a mixed analog signal 134. Mixer 124 is arranged to receive phase shifted analog signal 136 at the RF port and local analog oscillator signal 148 at the LO port. Mixer 124 is further arranged to output a mixed analog signal 138.

Combiner 126 is arranged to receive mixed analog signal 130, mixed analog signal 134 and mixed analog signal 138. Combiner 126 is further arranged to output a combined analog signal 146.

Antenna element 102, antenna element 104, antenna element 106 are elements of a PAA operable to receive and transmit an RF signal. LNA 108, LNA 110 and LNA 112 are operable to amplify received analog antenna signals without significantly degrading the signal to noise ratio. Phase shifter 114, phase shifter 116 and phase shifter 118 are analog devices operable to provide a continuously variable in-line phase shift of RF analog signals. A non-limiting example may be varactor diodes, which change capacitance with applied voltage. Mixer 120, mixer 122 and mixer 124 are three-port analog devices operable to modulate an RF analog signal with the application of a local oscillator signal at the LO port. Combiner 126 is an analog device operable to sum RF analog signals.

In this embodiment, LNA 108 amplifies analog antenna signal 150 and outputs amplified analog signal 140. A phase shift $e^{j\Phi 1}$ is then applied in-line with amplified analog signal 140 by phase shifter 114. Phase shifted analog signal 128 is then multiplied by local oscillator signal 148 at mixer 120 and the modulated output is mixed analog signal 130. LNA 110 amplifies analog antenna signal 152 and outputs amplified analog signal 142. Phase shift $e^{j\Phi 2}$ is then applied in-line with amplified analog signal 142 by phase shifter 116. Phase shifted analog signal 132 is then multiplied by local oscillator signal 148 at mixer 122 and the modulated output is mixed analog signal 134. LNA 112 amplifies analog antenna signal 154 and outputs amplified analog signal 144. Phase shift $e^{j\Phi 3}$ is then applied in-line with amplified analog signal 144 by phase shifter 118. Phase shifted analog signal 136 is then multiplied by local oscillator signal 148 at mixer 124 and the modulated output is mixed analog signal 138.

Each of antenna element 102, antenna element 104 and antenna element 106 is associated with an incremental phase offset necessary to electronically steer the received antenna beam. The phase offset is $e^{-j\Phi n}$, where n is the $n^{th}$ antenna element and $\Phi_n$ is the angle required to shift the phase of the $n^{th}$ antenna element so that when the antenna element signals are combined, the desired antenna beam is formed.

Mixed analog signal 130, mixed analog signal 134 and mixed analog signal 138 are modulated signals that have been down-converted to an intermediate frequency given by:

$$F_1 = f_{IF} = |f_{LO} - f_{RF}|, \quad (1)$$

where $f_{LO}$ is the local oscillator signal frequency and $f_{RF}$ is the frequency of mixed analog signal 130, mixed analog signal 134 and mixed analog signal 138. Mixed analog signal 130, mixed analog signal 134 and mixed analog signal 138 are combined (summed) at combiner 126 to provide combined analog signal 146, the received antenna beam.

Prior art RF analog beamforming architecture 100 uses in-line phase shifting architecture to shift the phase of each antenna element analog signal. This method has been widely adopted because of VLSI chip-level integration. However, this method imposes very strict RF performance specifications.

Another prior art architecture using a local oscillator (LO) phase shifting architecture to shift the phase of each antenna element analog signal will be discussed with further reference to FIG. 2.

Figure 2:
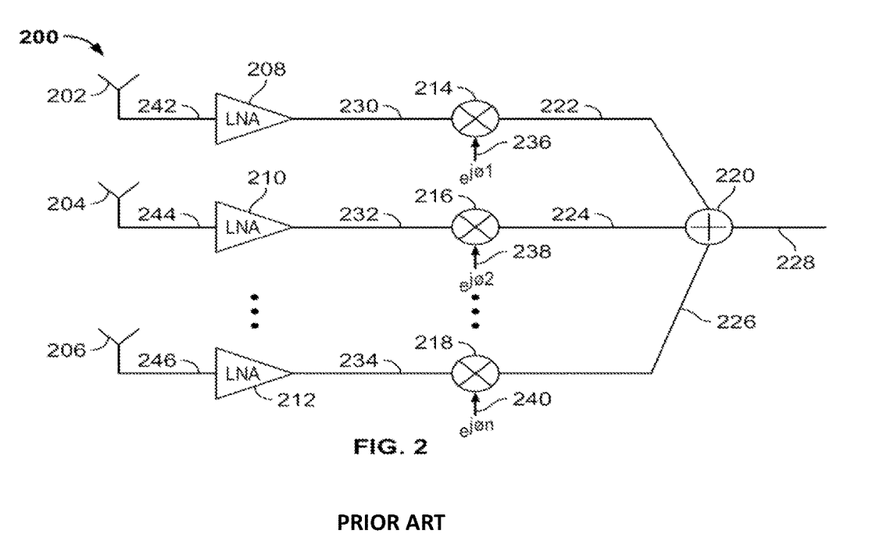
FIG. 2 illustrates a prior art RF analog beamforming architecture using local analog oscillator signal (LO) phase shifting architecture.

FIG. 2 illustrates a prior art RF analog beamforming architecture 200 using local analog oscillator signal (LO) phase shifting architecture.

As shown in the figure, prior art RF analog beamforming architecture 200 includes an antenna element 202, an antenna element 204, an antenna element 206, a LNA 208, a LNA 210, a LNA 212, a mixer 214, a mixer 216, a mixer 218 and a combiner 220.

LNA 208 is arranged to receive an analog antenna signal 242 from antenna element 202 and output an amplified analog signal 230. LNA 210 is arranged to receive an analog antenna signal 244 from antenna element 204 and output an amplified analog signal 232. LNA 212 is arranged to receive an analog antenna signal 246 from antenna element 206 and output an amplified analog signal 234.

Mixer 214 is arranged to receive amplified analog signal 230 at the RF port and a local oscillator signal 236 at the LO port. Mixer 214 is further arranged to output a mixed analog signal 222. Mixer 216 is arranged to receive amplified analog signal 232 at the RF port and a local oscillator signal 238 at the LO port. Mixer 216 is further arranged to output a mixed analog signal 224. Mixer 218 is arranged to receive amplified analog signal 234 at the RF port and a local oscillator signal 240 at the LO port. Mixer 218 is further arranged to output a mixed analog signal 226.

Combiner 220 is arranged to receive mixed analog signal 222, mixed analog signal 224 and mixed analog signal 226. Combiner 220 is further arranged to output a combined analog signal 228.

Antenna element 202, antenna element 204, antenna element 206 are elements of a PAA operable to receive and transmit an RF signal. LNA 208, LNA 210 and LNA 212 are operable to amplify received analog antenna signals without significantly degrading the signal to noise ratio. Mixer 214, mixer 216 and mixer 218 are three-port analog devices operable to modulate an RF analog signal with the application of a local oscillator at the LO port. Combiner 220 is an analog device operable to sum RF analog signals.

LNA 208 amplifies analog antenna signal 242 and outputs amplified analog signal 230. Amplified analog signal 230 is then modulated by multiplication with local oscillator signal 236 at mixer 214 and outputs mixed analog signal 222. LNA 210 amplifies analog antenna signal 244 and outputs amplified analog signal 232. Amplified analog signal 232 is then modulated by multiplication with local oscillator signal 238 at mixer 216 and outputs mixed analog signal 224. LNA 212 amplifies analog antenna signal 246 and outputs amplified analog signal 234. Amplified analog signal 234 is then modulated by multiplication with local oscillator signal 240 at mixer 218 and outputs mixed analog signal 226.

In this embodiment, a phase shift $e^{j\Phi 1}$ is applied to amplified analog signal 230 by letting local oscillator signal 236 equal $e^{j\Phi 1}$ and then modulating amplified analog signal 230 by multiplication at mixer 214 with local oscillator signal 236. Similarly, amplified signal 232 is modulated by multiplication at mixer 216 with local oscillator signal 238 set equal to $e^{j\Phi 2}$ and amplified signal 234 is modulated by multiplication at mixer 218 with local oscillator signal 240 set equal to $e^{j\Phi 3}$. In this way, mixed analog signal 222, mixed analog signal 224 and mixed analog signal 226 are the phase shifted signals that, when combined at combiner 220, produce combined analog signal 228, the desired antenna beam.

Prior art RF analog beamforming architecture 200 is an analog architecture that implements phase shifts using analog mixers. Similar to the system discussed above with reference to FIG. 1, RF analog beamforming architecture 200 also manifests in the analog/RF domain. However, in RF analog beamforming architecture 200, the phase shift is not in line with the RF signal. Rather, the phase shift is achieved through frequency multiplication. This method also imposes strict RF performance requirements, which are non-trivial.

Another embodiment using digital architecture will be discussed with further reference to FIG. 3.

Another type of prior art beamforming architecture works in the digital domain. This will be described with reference to FIGS. 3-4.

Figure 3:
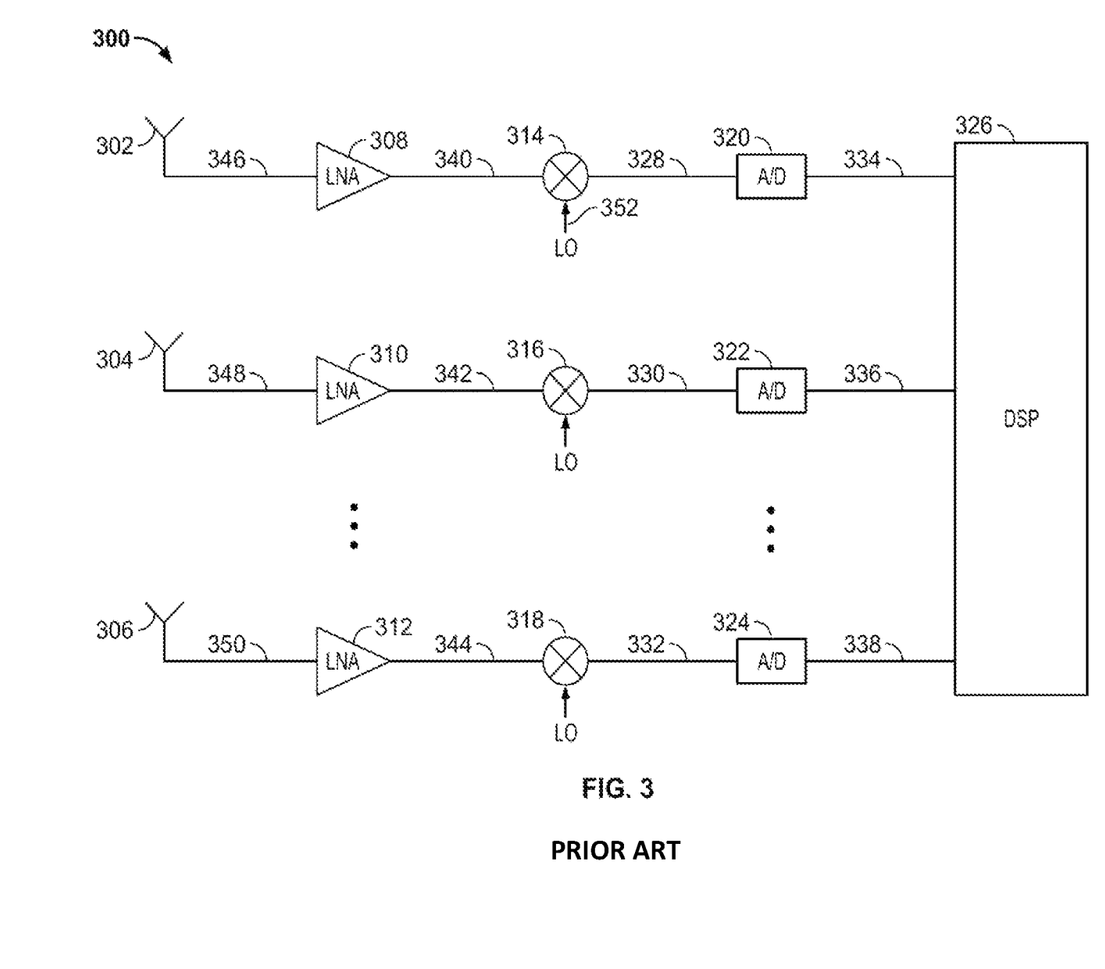
FIG. 3 illustrates a prior art digital beamforming (DBF) architecture.

FIG. 3 illustrates a prior art digital beamforming (DBF) architecture 300.

As illustrated in the figure, prior art DBF architecture 300 includes an antenna element 302, an antenna element 304, an antenna element 306, a LNA 308, a LNA 310, a LNA 312, a mixer 314, a mixer 316, a mixer 318, an analog to digital converter (ADC) 320, an ADC 322, an ADC 324 and a digital signal processor (DSP) 326.

LNA 308 is arranged to receive an analog antenna signal 346 from antenna element 302 and output an amplified analog signal 340. LNA 310 is arranged to receive an analog antenna signal 348 from antenna element 304 and output an amplified analog signal 342. LNA 312 is arranged to receive an analog antenna signal 350 from antenna element 306 and output an amplified analog signal 344.

Mixer 314 is arranged to receive amplified analog signal 340 at the RF port and a local analog oscillator signal 352 at the LO port. Mixer 314 is further arranged to output a mixed analog signal 328. Mixer 316 is arranged to receive amplified analog signal 342 at the RF port and local analog oscillator signal 352 at the LO port. Mixer 316 is further arranged to output a mixed analog signal 330. Mixer 318 is arranged to receive amplified analog signal 344 at the RF port and local analog oscillator signal 352 at the LO port. Mixer 318 is further arranged to output a mixed analog signal 332.

ADC 320 is arranged to receive mixed analog signal 328 and to output a digital signal 334. ADC 322 is arranged to receive mixed analog signal 330 and to output a digital signal 336. ADC 324 is arranged to receive mixed analog signal 332 and to output a digital signal 338.

DSP 326 is arranged to receive digital signal 334, digital signal 336 and digital signal 338.

Antenna element 302, antenna element 304 and antenna element 306 are elements of a PAA operable to receive and transmit an RF signal. LNA 308, LNA 310 and LNA 312 are operable to amplify received analog antenna signals without significantly degrading the signal to noise ratio. Mixer 314, mixer 316 and mixer 318 are three-port analog devices operable to modulate an RF analog signal with the application of a local oscillator at the LO port. ADC 320, ADC 322 and ADC 324 are any low-power, high speed, high resolution analog to digital conversion device suitable for beamforming applications. DSP 326 is a device or system of devices operable to accept multiple digital channel inputs in order to digitally perform beamforming processes such as, but not limited to, phase shifting and amplitude scaling of each channel and summation of all channels. Non-limiting examples may be general purpose digital signal processing (DSP) chips or dedicated beamforming chips.

In this embodiment, LNA 308 amplifies analog antenna signal 346 and outputs amplified analog signal 340. Amplified analog signal 340 is then modulated by multiplication with local analog oscillator signal 352 at mixer 314 and outputs mixed analog signal 328. Similarly, LNA 310 amplifies analog antenna signal 348 and outputs amplified analog signal 342. Amplified analog signal 342 is then modulated by multiplication with local analog oscillator signal 352 at mixer 316 and outputs mixed analog signal 330. Further, LNA 312 amplifies analog antenna signal 350 and outputs amplified analog signal 344. Amplified analog signal 344 is then modulated by multiplication with local analog oscillator signal 352 at mixer 318 and outputs mixed analog signal 332.

Amplified analog signal 340, amplified analog signal 342 and amplified analog signal 344 are RF signals that must be down-converted to a low-IF because analog to digital converters often cannot sample at a sufficient rate to represent RF/microwave frequencies. In this example, all channels are down-converted to an identical low-IF. To accomplish this, amplified analog signal 340 is multiplied at mixer 314 by local analog oscillator signal 352, amplified analog signal 342 is multiplied at mixer 316 by local analog oscillator signal 352 and amplified analog signal 344 is multiplied at mixer 318 by local analog oscillator signal 352. Mixed analog signal 328, mixed analog signal 330 and mixed signal 332 are then ready to be digitized.

Since each channel is now at the same low-IF, a separate A/D is required for each channel. ADC 320 creates a digital representation of mixed analog signal 328 and outputs digital signal 334. ADC 322 creates a digital representation of mixed analog signal 330 and outputs digital signal 336. ADC 324 creates a digital representation of mixed analog signal 332 and outputs digital signal 338. Digital signal 334, digital signal 336 and digital signal 338 are then all sent to DSP 326 for processing.

Prior art DBF architecture 300 uses a separate analog to digital converter for each channel and inputs a digital signal from each channel to a DSP processor. DBF architecture 300 requires less strict RF performance requirements as required by the analog systems discussed above with reference to FIGS. 1-2, because DBF architecture 300 operates in the digital domain. Another advantage of DBF architecture 300 is that the ADC in each channel is only required to sample at twice the signal's bandwidth. However, DBF architecture 300 requires a large physical area in addition to high power consumption.

Another embodiment with additional detail will be described with further reference to FIG. 4.

Figure 4:
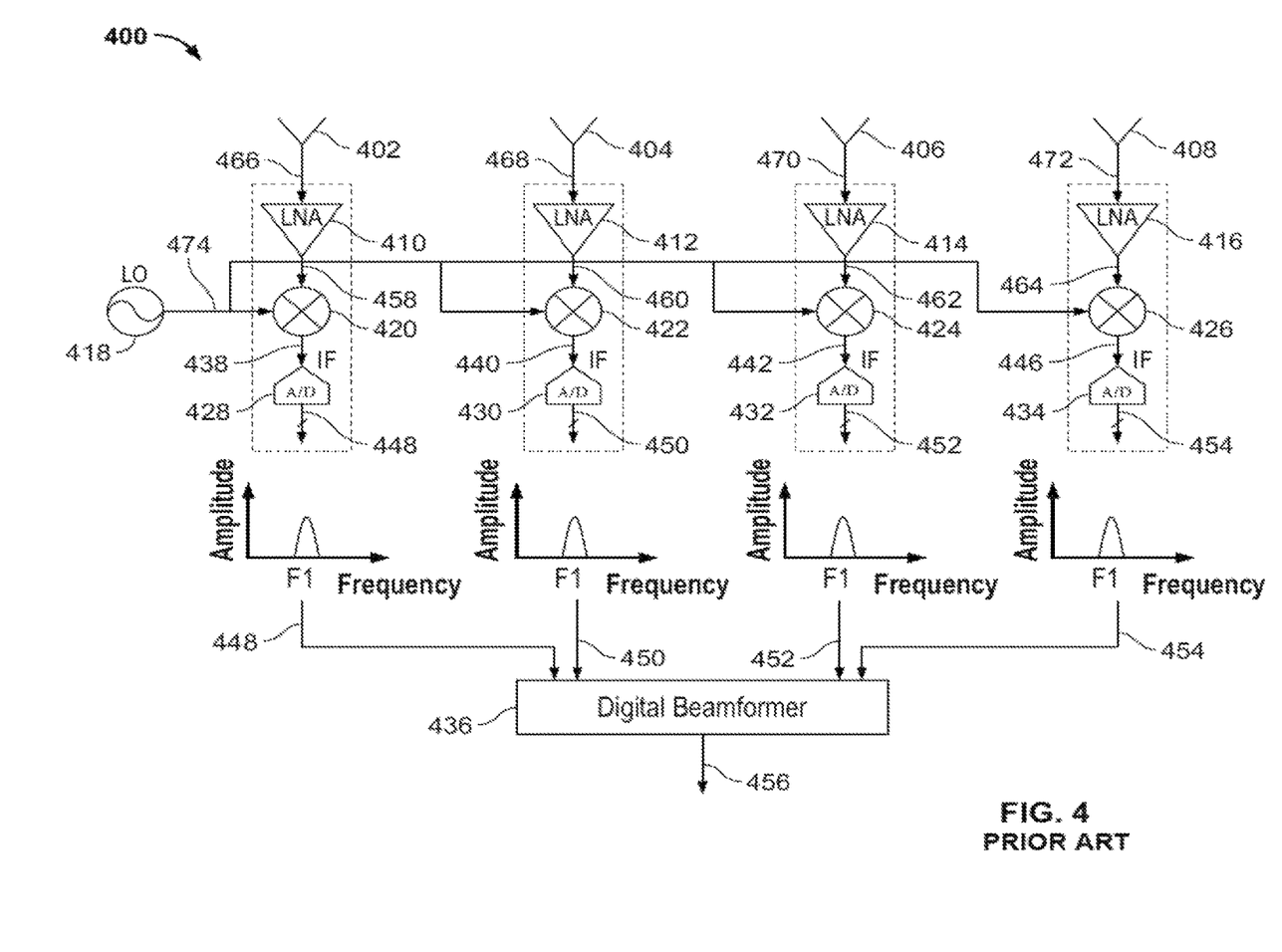
FIG. 4 illustrates a prior art DBF architecture.

FIG. 4 illustrates a prior art DBF architecture 400.

As shown in the figure, prior art DBF architecture 400 includes an antenna element 402, an antenna element 404, an antenna element 406, an antenna element 408, a LNA 410, a LNA 412, a LNA 414, a LNA 416, a local oscillator 418, a mixer 420, a mixer 422, a mixer 424, a mixer 426, an ADC 428, an ADC 430, an ADC 432, an ADC 434 and a DBF processor 436.

LNA 410 is arranged to receive an analog antenna signal 466 from antenna element 402 and output an amplified analog signal 458. LNA 412 is arranged to receive an analog antenna signal 468 from antenna element 404 and output an amplified analog signal 460. LNA 414 is arranged to receive an analog antenna signal 470 from antenna element 406 and output an amplified analog signal 462. LNA 416 is arranged to receive an analog antenna signal 472 from antenna element 408 and output an amplified analog signal 464.

Mixer 420 is arranged to receive amplified analog signal 458 at the RF port and a local analog oscillator signal 474 at the LO port. Mixer 420 is further arranged to output a mixed analog signal 438. Mixer 422 is arranged to receive amplified analog signal 460 at the RF port and local analog oscillator signal 474 at the LO port. Mixer 422 is further arranged to output a mixed analog signal 440. Mixer 424 is arranged to receive amplified analog signal 462 at the RF port and local analog oscillator signal 474 at the LO port. Mixer 424 is further arranged to output a mixed analog signal 442. Mixer 426 is arranged to receive amplified analog signal 464 at the RF port and local analog oscillator signal 474 at the LO port. Mixer 426 is further arranged to output a mixed analog signal 446.

ADC 428 is arranged to receive mixed analog signal 438 and to output a digital signal 448. ADC 430 is arranged to receive mixed analog signal 440 and to output a digital signal 450. ADC 432 is arranged to receive mixed analog signal 442 and to output a digital signal 452. ADC 434 is arranged to receive mixed analog signal 446 and to output a digital signal 454.

DBF processor 436 is arranged to receive digital signal 448, digital signal 450, digital signal 452 and digital 454. DBF processor 436 is further arranged to output a digital signal 456.

Antenna element 402, antenna element 404, antenna element 406 and antenna element 408 are elements of a PAA operable to receive and transmit an RF signal. LNA 410, LNA 412, LNA 414 and LNA 416 are operable to amplify received analog antenna signals without significantly degrading the signal to noise ratio. Mixer 420, mixer 422, mixer 424 and mixer 426 are three-port analog devices operable to modulate an RF analog signal with the application of a local oscillator at the LO port. ADC 428, ADC 430, ADC 432 and ADC 434 are any low-power, high speed, high resolution analog to digital conversion devices suitable for beamforming applications. DBF processor 436 is a device or system of devices operable to accept multiple digital channel inputs in order to digitally perform beamforming processes such as, but not limited to, phase shifting and amplitude scaling of each channel and summation of all channels. Non-limiting examples may be general purpose DSP chips or dedicated beamforming chips.

In this embodiment, LNA 410 amplifies analog antenna signal 466 and outputs amplified analog signal 458. LNA 412 amplifies analog antenna signal 468 and outputs amplified analog signal 460. LNA 414 amplifies analog antenna signal 470 and outputs amplified analog signal 462. LNA 416 amplifies analog antenna signal 472 and outputs amplified analog signal 464.

Amplified analog signal 458, amplified analog signal 460, amplified analog signal 462 and amplified analog signal 464 are RF signals that must be down-converted to a low-IF because analog to digital converters often cannot sample at a sufficient rate to represent RF/microwave frequencies. In this example, all four channels are down-converted to the identical low-IF. To accomplish this, amplified analog signal 458 is multiplied at mixer 420 by local analog oscillator signal 474, amplified analog signal 460 is multiplied at mixer 422 by local analog oscillator signal 474, amplified analog signal 462 is multiplied at mixer 424 by local analog oscillator signal 474 and amplified analog signal 464 is multiplied at mixer 426 by local analog oscillator signal 474.

Mixed analog signal 438, mixed analog signal 440, mixed signal 442 and mixed analog signal 446 are then ready to be digitized.

Since each channel is at an identical low-IF, the four channels must be physically isolated from each other. This is accomplished by providing each channel with a separate ADC, which must only sample at twice the signal bandwidth. For example, if the channel signal has an instantaneous bandwidth of 100 MHz, the ADC must be capable of sampling at 200 Mbps. Mixed analog signal 438 is digitized by ADC 428, mixed analog signal 440 is digitized by ADC 430, mixed signal 442 is digitized by ADC 432 and mixed analog signal 446 is digitized by ADC 434. The digital representations of each channel are given by digital signal 448, digital signal 450, digital signal 452 and digital signal 454, which are then input to DBF processor 436. The output of DBF processor 436, digital signal 456, is the beam-formed received antenna beam.

The system of FIG. 4 explains how in the system discussed above with reference to FIG. 3, every channel is down-converted to an identical IF frequency. In this way, every single channel is identical to the next, and therefore each channel needs to be physically isolated from each other. The benefit of this method is that the ADC only needs to operate at twice the signal bandwidth. Also, since each channel is identical, the LO distribution is simple. The drawbacks of the systems of FIGS. 3-4 are that for N-number of channels, N-number of ADCs and N-number of Input/Outputs are required between the beamforming DSP and the ADCs.

A beam forming system in accordance with the present invention overcomes the drawbacks of the prior art systems discussed above. Specifically, a beam forming system of the present invention operates in the digital domain, thus it provides relatively lenient RF performance requirements as compared to the analog prior art systems discussed above with reference to FIGS. 1-2. Further, a beam forming system of the present invention includes only a single ADC (or in the case of a transmitter a single digital to analog converter (DAC)). The use of a single ADC drastically reduces the real estate on the chip and the power requirements for operation as compared to the digital prior art systems discussed above with reference to FIGS. 3-4.

In accordance with aspects of the present invention, the ability to distinguish between channels is indicative of multiplexing. Frequency division multiplexing (FDM) can be used to encode each channel so it is possible to use a single ADC for all channels. Channels are quickly down-converted to a low-IF in order to comply with ADC sampling limitations. If a local oscillator (LO) signal is split into different frequencies $f_{LO}, f_{LO}+\Delta f, f_{LO}+2\Delta f, f_{LO}+3\Delta f, \ldots$, then the corresponding IF frequencies will be $f_{IF}, f_{IF}+\Delta f, f_{IF}+2\Delta f, f_{IF}+3\Delta f; \ldots$. Since each channel is now isolated from the next by frequency, a single ADC can be used for all channels, although it must be faster since the total bandwidth of the desired spectrum has been increased. The combined digital signal (which includes all channel information at distinct frequencies) from the ADC can then be down-sampled by polyphase filtering and the signal spectrum channelized by an inverse Fourier transform (IFFT). Complex DBF weights can then be applied to each channel in order to form the received antenna beam. For transmitting, the channelized beam-formed signal to be transmitted can be converted from digital to analog using only one digital to analog converter (DAC).

Any method of multiplexing the signal could be used. Code Division Multiple Access (CDMA) could also be used to uniquely code each channel. If CDMA was used, then each channel would need to be multiplied with a chipping code.

The benefit of the present invention is that only one ADC is required for a plurality of receiving antenna elements and only one DAC is required for a plurality of transmitting antenna elements. This saves space, weight, power consumption and cost. In addition, down-sampling of the combined digital signal by polyphase filtering saves processing resources.

Example embodiments of beamforming architectures in accordance with aspects of the present invention will now be described with reference to FIGS. 5-7.

Prior art DBF architecture 400 modulates the analog signal for each channel with an identical local oscillator signal frequency. Another embodiment that splits the local oscillator signal in order to modulate each channel by a different frequency will be described with further reference to FIG. 5.

A beamforming receiving antenna system in accordance with aspects of the present invention will now be described with reference to FIGS. 5-6.

Figure 5:
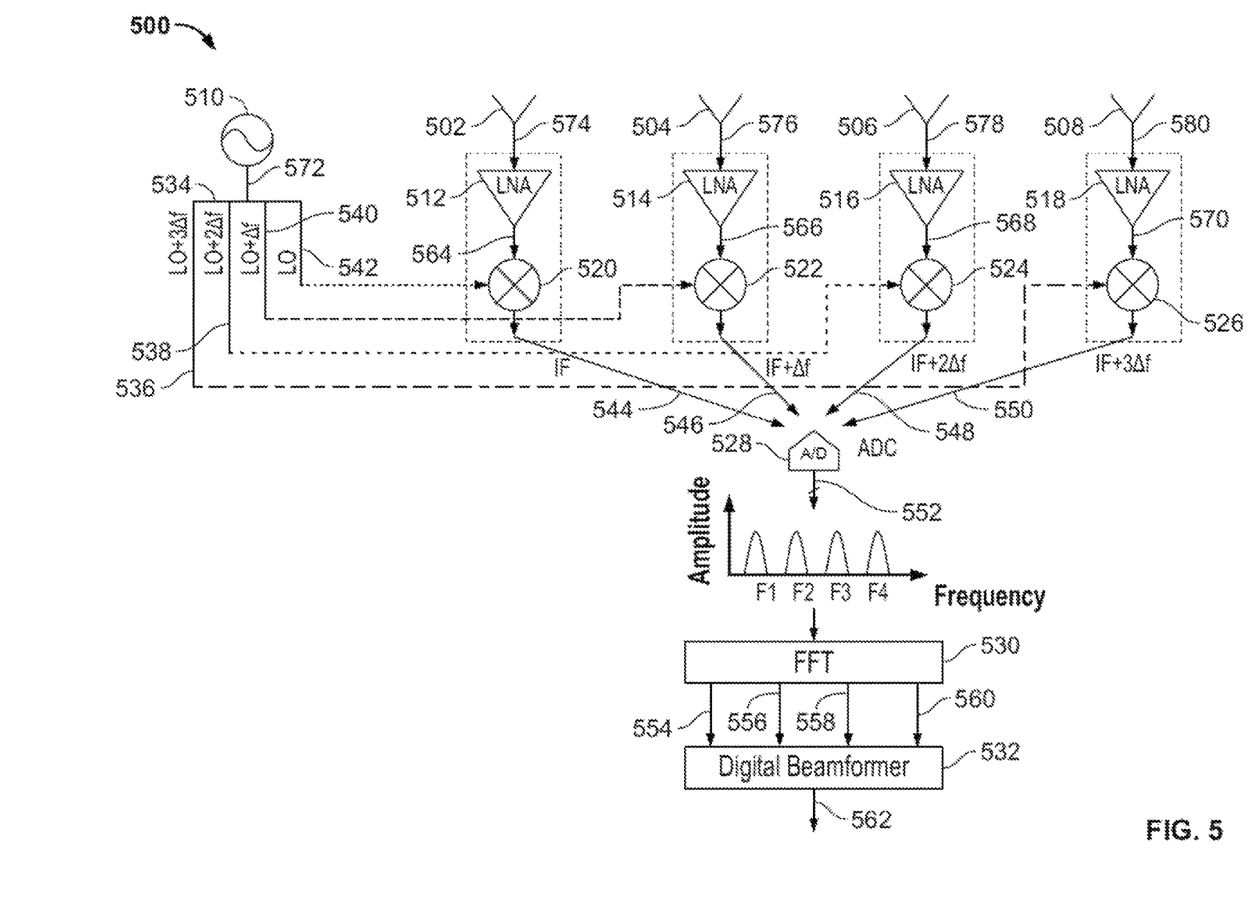
FIG. 5 illustrates a DBF architecture using frequency division multiplexing (FDM) in accordance with aspects of the present invention.

FIG. 5 illustrates a DBF 500 using frequency division multiplexing (FDM) in accordance with aspects of the present invention.

As shown in the figure, DBF architecture 500 includes an antenna element 502, an antenna element 504, an antenna element 506, an antenna element 508, a LNA 512, a LNA 514, a LNA 516, a LNA 518, a local oscillator 510, a splitter 534, a mixer 520, a mixer 522, a mixer 524, a mixer 526, an ADC 528, a fast Fourier transform (FFT) processor 530 and a DBF processor 532.

LNA 512 is arranged to receive an analog antenna signal 574 from antenna element 502 and output an amplified analog signal 564. LNA 514 is arranged to receive an analog antenna signal 576 from antenna element 504 and output an amplified analog signal 566. LNA 516 is arranged to receive an analog antenna signal 578 from antenna element 506 and output an amplified analog signal 568. LNA 518 is arranged to receive an analog antenna signal 580 from antenna element 508 and output an amplified analog signal 570.

Splitter 534 is arranged to receive a local analog oscillator signal 572 from local oscillator 510. Splitter 534 is further arranged to output a split analog oscillator signal 542, a split analog oscillator signal 540, a split analog oscillator signal 538 and a split analog oscillator signal 536.

Mixer 520 is arranged to receive amplified analog signal 564 at the RF port and split analog oscillator signal 542 at the LO port. Mixer 520 is further arranged to output a mixed analog signal 544. Mixer 522 is arranged to receive amplified analog signal 566 at the RF port and split analog oscillator signal 540 at the LO port. Mixer 522 is further arranged and to output a mixed analog signal 546. Mixer 524 is arranged to receive amplified analog signal 568 at the RF port and split analog oscillator signal 538 at the LO port. Mixer 524 is further arranged to output a mixed analog signal 548. Mixer 526 is arranged to receive amplified analog signal 570 at the RF port and split analog oscillator signal 536 at the LO port. Mixer 526 is further arranged to output a mixed analog signal 550.

ADC 528 is arranged to receive mixed analog signal 544, mixed analog signal 546, mixed analog signal 548 and mixed analog signal 550. ADC 528 is further arranged to output a combined digital signal 552.

FFT processor 530 is arranged to receive combined digital signal 552. FFT processor 530 is further arranged to output a first frequency signal 554, a second frequency signal 556, a third frequency signal 558 and a fourth frequency signal 560.

DBF processor 532 is arranged to receive frequency signal 554, second frequency signal 556, frequency signal 558 and fourth frequency signal 560. DBF processor 532 is further arranged to output a received signal 562.

Antenna element 502, antenna element 504, antenna element 506 and antenna element 508 are elements of a PAA operable to receive and transmit an RF signal. LNA 512, LNA 514, LNA 516 and LNA 518 are operable to amplify received analog antenna signals without significantly degrading the signal to noise ratio. Splitter 534 is any device operable to split a sinusoidal signal into multiple signals, each at a distinct, equidistant frequency. Mixer 520, mixer 522, mixer 524 and mixer 526 are three-port analog devices operable to modulate an RF analog signal with the application of a local oscillator signal at the LO port. ADC 528 is a low-power, high speed, high resolution analog to digital conversion device operable to sample at 2×M×the instantaneous signal bandwidth, where M is the number of antenna elements. DBF processor 532 is a device or system of devices operable to accept multiple digital channel inputs and digitally perform processes on each such as, but not limited to, phase shifting and amplitude scaling of each channel and summation of all channels. Non-limiting examples may be general purpose DSP chips or dedicated beamforming chips.

In this embodiment, LNA 512 amplifies analog antenna signal 574 and outputs amplified analog signal 564. LNA 514 amplifies analog antenna signal 576 and outputs amplified analog signal 566. LNA 516 amplifies analog antenna signal 578 and outputs amplified analog signal 568. LNA 518 amplifies analog antenna signal 580 and outputs amplified analog signal 570.

Frequency division multiplexing (FDM) is used in order to provide a distinguishing factor (frequency) for each channel. In FDM, the total bandwidth available is divided into a series of non-overlapping frequency sub-bands, each of which is used to carry a separate signal. To accomplish this, local analog oscillator signal 572 of frequency $f_{LO}$ is divided by splitter 534 into four split analog oscillator signals, split analog oscillator signal 542 at frequency $f_{LO}$, split analog oscillator signal 540 at frequency $f_{LO}+\Delta f$, split analog oscillator signal 538 at frequency $f_{LO}+2\Delta f$ and split analog oscillator signal 536 at frequency $f_{LO}+3\Delta f$.

Amplified analog signal 564 is modulated by multiplication with split analog oscillator signal 542 at mixer 520, which outputs mixed analog signal 544. Amplified analog signal 566 is modulated by multiplication with split analog oscillator signal 540 at mixer 522, which outputs mixed analog signal 546. Amplified analog signal 568 is then modulated by multiplication with split oscillator signal 538 at mixer 524, which outputs mixed analog signal 548. Amplified analog signal 570 is then modulated by multiplication with split oscillator signal 536 at mixer 526, which outputs mixed analog signal 550.

As a result, each amplified analog signal is down-converted to a distinct low-IF frequency in order to isolate the channels from each other. In this example, split analog oscillator signal 542 down-converts amplified analog signal 564 at mixer 520 to low-IF, $F_1$, wherein $F_1$ is defined by equation (1) above. Split analog oscillator signal 540 down-converts amplified analog signal 566 at mixer 522 to low-IF, $F_2$, where:

$$F_2 = f_{CIF} + \Delta f = |(f_{LO} + \Delta f) - f_{RF}|. \qquad (2)$$

Split analog oscillator signal 538 down-converts amplified analog signal 568 at mixer 524 to low-IF, $F_3$, where:

$$F_3 = f_{IF} + 2\Delta f = |(f_{LO} + 2\Delta f) - f_{RF}|. \quad (3)$$

Split analog oscillator signal 536 down-converts amplified analog signal 570 at mixer 526 to fourth low-IF, $F_4$, where:

$$F_4 = f_{IF} + 3\Delta f = |(f_{LO} + 3\Delta f) - f_{RF}|. \quad (4)$$

Since mixed analog signal 544, mixed analog signal 546, mixed analog signal 548 and mixed analog signal 550 are now uniquely represented, ADC 528 can be used to provide an aggregate digital representation of all four analog signals. This digital representation is combined digital signal 552.

Since each channel occupies a certain bandwidth, the total bandwidth of the desired spectrum has been increased. For this reason, ADC 528 must sample at eight times the signal bandwidth. For example, if the instantaneous signal bandwidth is 100 MHz, ADC 528 must be capable of sampling at 800 Mbps.

The frequency spectrum of combined digital signal 552 is channelized by performing a fast Fourier transform at FFT processor 530. The result is frequency signal 554, the samples at $F_1$, frequency signal 556, the samples at $F_2$, frequency signal 558, the samples at $F_3$ and frequency signal 560, the samples at $F_4$. The four frequency signals are then input to DBF processor 532 for beamforming. The output of DBF processor 532 is received signal 562, the beam-formed received antenna beam.

DBF architecture 500 channelizes the spectrum of the combined digital signal by performing an FFT. Another embodiment that channelizes the spectrum of the combined digital signal using a polyphase filter will be described with further reference to FIG. 6.

Figure 6:
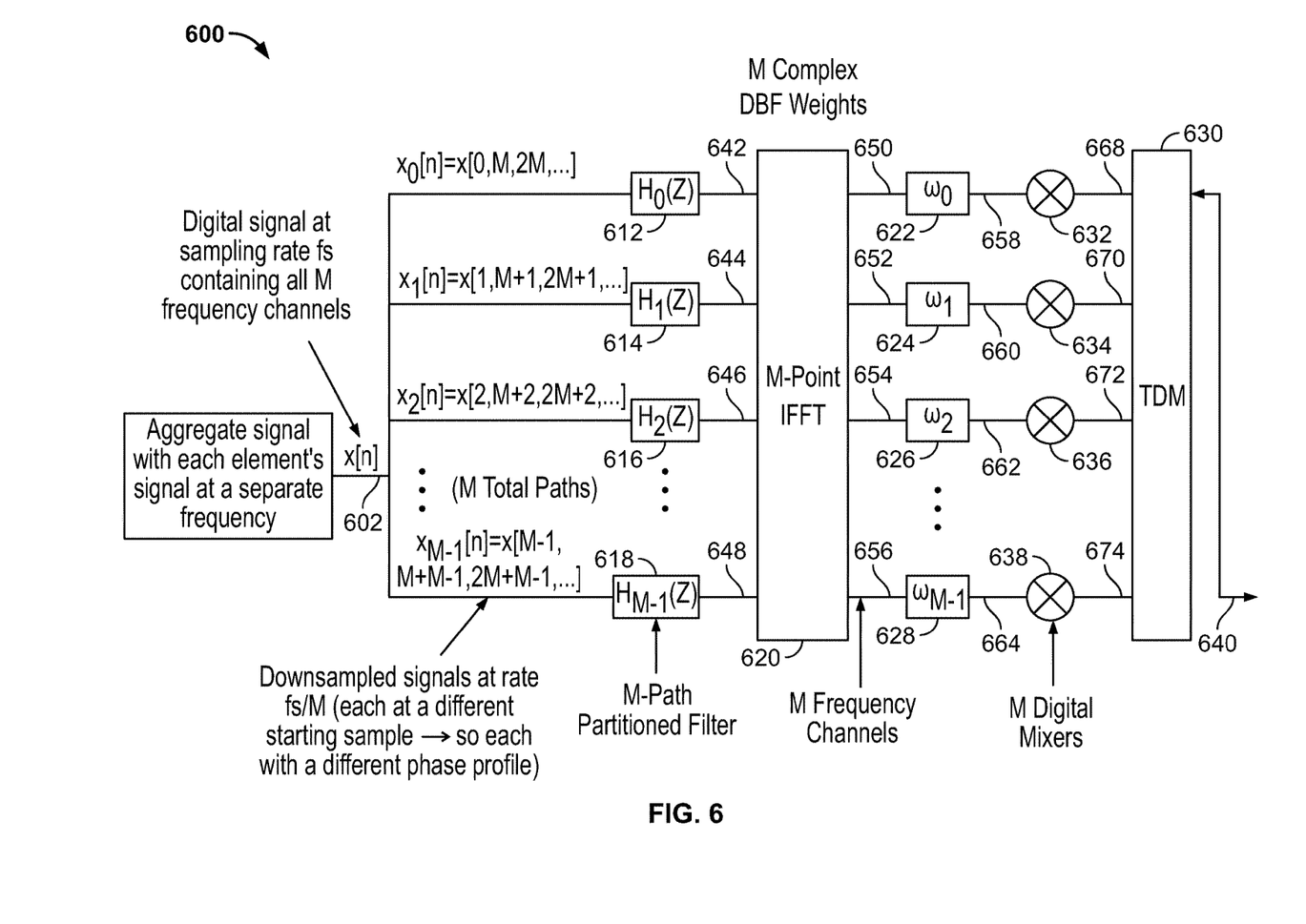
FIG. 6 illustrates a digital channelizer and beam-former in accordance with aspects of the present invention.

FIG. 6 illustrates a digital channelizer and beam-former 600 in accordance with aspects of the present invention.

As shown in the figure, digital channelizer and beam-former 600 includes a filter 612, a filter 614, a filter 616, a $M_{th}$ filter 618, an inverse fast Fourier transform (IFFT) component 620, a weighting component 622, a weighting component 624, a weighting component 626, a $M_{th}$ weighting component 628, a mixer 632, a mixer 634, a mixer 636, a $M_{th}$ mixer 638, and a time division multiplexer (TDM) 630.

Filter 612, filter 614, filter 616 and $M_{th}$ filter 618 are arranged to receive a combined digital signal 602. Filter 612 is further arranged to output a filtered signal 642. Filter 614 is further arranged to output a filtered signal 644. Filter 616 is further arranged to output a filtered signal 646. $M_{th}$ filter 618 is further arranged to output an $M_{th}$ filtered signal 648.

IFFT component 620 is arranged to receive filtered signal 642, filtered signal 644, filtered signal 646 and $M_{th}$ filtered signal 648. IFFT component 620 is further arranged to output a transformed signal 650, a transformed signal 652, a transformed signal 654 and an $M_{th}$ transformed signal 656.

Weighting component 622 is arranged to receive transformed signal 650 and is further arranged to output a weighted signal 658. Weighting component 624 is arranged to receive transformed signal 652 and is further arranged to output a weighted signal 660. Weighting component 626 is arranged to receive transformed signal 654 and is further arranged to output a weighted signal 662. $M_{th}$ weighting component 628 is arranged to receive $M_{th}$ transformed signal 656 and is further arranged to output an $M_{th}$ weighted signal 664.

Mixer 632 is arranged to receive weighted signal 658 and is further arranged to output a demodulated signal 668. Mixer 634 is arranged to receive weighted signal 660 and is further arranged to output a demodulated signal 670. Mixer 636 is arranged to receive weighted signal 662 and is further arranged to output a demodulated signal 672. $M_{th}$ mixer 638 is arranged to receive $M_{th}$ weighted signal 664 and is further arranged to output an $M_{th}$ demodulated signal 674.

TDM 630 is arranged to receive demodulated signal 668, demodulated signal 670, demodulated signal 672 and $M_{th}$ demodulated signal 674 and is further arranged to output a received signal 640.

Filter 612, filter 614, filter 616 and $M_{th}$ filter 618 make up a polyphase filter, an M-path partitioned filter operable to channelize a combined digital signal by down-sampling at a rate $f_s/M$, where $f_s$ is the sampling rate of the combined signal and M is the number of channels. IFFT component 620 is operable to perform an M-point IFFT and output M frequency channels. Weighting component 622, weighting component 624, weighting component 626 and $M_{th}$ weighting component 628 are operable to multiply a complex digital signal by a complex phase weight $\omega_i$, where i is the $i^{th}$ weighting component. TDM 630 is a time division multiplexer operable to combine multiple channels of digital data into a single data stream by designating a transmission time slot per channel. Mixer 632, mixer 634, mixer 636 and $M_{th}$ mixer 638 are digital devices operable to demodulate a digital signal.

In this embodiment, digital channelizer and beam-former 600 channelizes combined digital signal 602 using an M-path partitioned filter consisting of filter 612, filter 614, filter 616 and $M_{th}$ filter 618, where M is the number of frequency channels in combined digital signal 602.

An M-path partitioned filter partitions a group of filter coefficients among M channels to save processing resources. For example, if M=4, and there were four filter coefficients, normally there would be four different four-coefficient filters, each filtering combined digital signal 602. A 4-path partitioned filter would place the first coefficient on a path 1, the second coefficient on a path 2, the third coefficient on a path 3 and the fourth coefficient on a path 4. If the combined digital signal is x(n), the first coefficient would sample x(0, 4, 8, . . . ), the second coefficient would sample x(1, 5, 9, . . . ), the third coefficient would sample x(2, 6, 10, . . . ) and the fourth coefficient would sample x(3, 7, 11, . . . ). For M paths and M coefficients, the coefficients would be partitioned among M filters so that the first filter (first coefficient) would sample x(0, M, 2M, . . . ), the second filter (second coefficient) would sample x(1, M+1, 2M+1, . . . ) the third filter (third coefficient) would sample x(2, M+2, 2M+2, . . . ) and the $M_{th}$ filter ($M_{th}$ coefficient) would sample x(M−1, M+M−1, 2M+M−1, . . . ). Each channel is down-sampled at a rate $f_s/M$, where $f_s$ is the original sampling rate and has a different starting sample.

Referring to the figure, filter 612 samples $x_0(n)$=x(0, M, 2M, . . . ), filter 614 samples $x_1(n)$=x(1, M+1, 2M+1, . . . ), filter 616 samples $x_2(n)$=(2, M+2, 2M+2, . . . ) and $M_{th}$ filter 618 samples $x_{M-1}(n)$=x(M−1,M+M−1, 2M+M−1, . . . ) as discussed above.

IFFT component 620 performs an M-point IFFT on filtered signal 642, filtered signal 644, filtered signal 646 and $M_{th}$ filtered signal 648. This produces M independent frequency channels, transformed signal 650, transformed signal 652, transformed signal 654 and $M_{th}$ transformed signal 656.

Once the M independent frequency channels have been recovered by the IFFT, each channel must be weighted in order to form the desired received signal. To accomplish this, each of the M frequency channels is then multiplied by a complex DBF weight in order to shift the phase by the necessary amount to form the desired received antenna beam. Referring to the figure, transformed signal 650 is multiplied by $\omega_0$, transformed signal 652 is multiplied by $\omega_1$, transformed signal 654 is multiplied by $\omega_2$, and $M_{th}$ transformed signal 656 is multiplied by $\omega_{M-1}$.

After each frequency channel is weighted, weighted signal 658 is demodulated at mixer 632, weighted signal 660 is demodulated at mixer 634, weighted signal 662 is demodulated at mixer 636, and $M_{th}$ weighted signal 664 is demodulated at $M_{th}$ mixer 638.

After demodulation, demodulated signal 668, demodulated signal 670, demodulated signal 672 and $M_{th}$ demodulated signal 674 are multiplexed by time division multiplexer (TDM) 630 to form the beam-formed received signal, received signal 640.

Digital channelizer and beam-former 600 is described in terms of a beam-formed received antenna signal. Another embodiment of DBF architecture that transmits a beam-formed signal will be described with further reference to FIG. 7.

A transmitting DBF system in accordance with aspects of the present invention will now be described with reference to FIG. 7.

Figure 7:
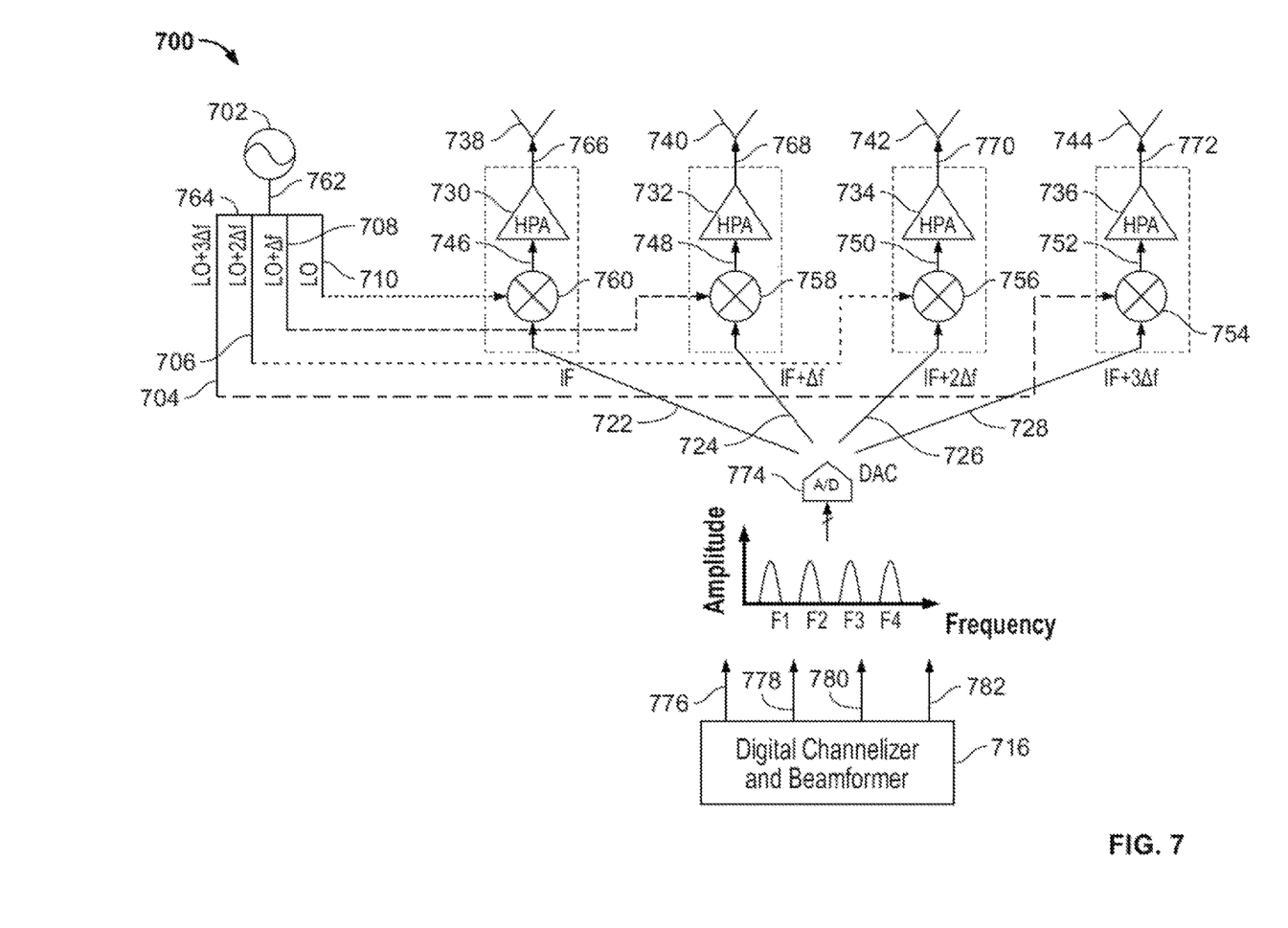
FIG. 7 illustrates a transmitting DBF architecture in accordance with aspects of the present invention.

FIG. 7 illustrates a transmitting DBF architecture 700 in accordance with aspects of the present invention.

As shown in the figure, transmitting DBF architecture 700 includes an antenna element 738, an antenna element 740, an antenna element 742, an antenna element 744, a high power amplifier (HPA) 730, an HPA 732, a HPA 734, a HPA 736, a LO 702, a splitter 764, a mixer 760, a mixer 758, a mixer 756, a mixer 754, a digital to analog converter (DAC) 774 and a digital channelizer and beam-former 716.

Digital channelizer and beam-former 716 is arranged to output a frequency signal 776, a frequency signal 778, a frequency signal 780 and a frequency signal 782. DAC 774 is arranged to receive frequency signal 776, frequency signal 778, frequency signal 780 and frequency signal 782. DAC 774 is further arranged to output an analog signal 722, an analog signal 724, an analog signal 726 and an analog signal 728.

Splitter 764 is arranged to receive a local analog oscillator signal 762 from LO 702. Splitter 764 is further arranged to output a split analog oscillator signal 710, a split analog oscillator signal 708, a split analog oscillator signal 706 and a split analog oscillator signal 704.

Mixer 760 is arranged to receive analog signal 722 at the IF port and split analog oscillator signal 710 at the LO port. Mixer 760 is further arranged to output a mixed analog signal 746. Mixer 758 is arranged to receive analog signal 724 at the IF port and split analog oscillator signal 708 at the LO port. Mixer 758 is further arranged to output a mixed analog signal 748. Mixer 756 is arranged to receive analog signal 726 at the IF port and split analog oscillator signal 706 at the LO port. Mixer 756 is further arranged to output a mixed analog signal 750. Mixer 754 is arranged to receive analog signal 728 at the IF port and split analog oscillator signal 704 at the LO port. Mixer 754 is further arranged to output a mixed analog signal 752.

HPA 730 is arranged to receive mixed analog signal 746 and output a RF antenna signal 766. HPA 732 is arranged to receive mixed analog signal 748 and output a RF antenna signal 768. HPA 734 is arranged to receive mixed analog signal 750 and output a RF antenna signal 770. HPA 736 is arranged to receive mixed analog signal 752 and output a RF antenna signal 772.

Antenna element 738 is arranged to receive RF antenna signal 766, antenna element 740 is arranged to receive RF antenna signal 768, antenna element 742 is arranged to receive RF antenna signal 770 and antenna element 744 is arranged to receive RF antenna signal 772.

Antenna element 738, antenna element 740, antenna element 742 and antenna element 744 are elements of a PAA operable to receive and transmit an RF signal. HPA 730, HPA 732, HPA 734 and HPA 736 are operable for high power amplification at RF frequencies. Splitter 764 is a device operable to split a sinusoidal signal into multiple signals, each at a distinct frequency. Mixer 760, mixer 758, mixer 756 and mixer 754 are three-port analog devices operable to demodulate a low-IF analog signal with the application of a local analog oscillator signal at the LO port. DAC 774 is a device operable to convert digital data to analog data. Digital channelizer and beam-former 716 is a device operable to output the frequency components of a modulated, beam-formed antenna signal as discussed with reference to FIG. 6.

Referring to FIG. 6, weighted signal 658, weighted signal 660, weighted signal 662 and weighted signal 664 are the frequency components of the modulated beam-formed signal. These signals are at frequency $F_1$ described above with reference to equation (1), frequency $F_2$ described above with reference to equation (2), frequency $F_3$ described above with reference to equation (3) and frequency $F_4$, where:

$$F_4 = f_{IF} + 3\Delta f \quad (4)$$

These four channels can be sent to a receiving module for digital to analog conversion and demodulation.

Referring back to FIG. 7, digital channelizer and beam-former 716 outputs the four weighted frequency signals given by frequency signal 776, frequency signal 778, frequency signal 780 and fourth frequency signal 782. For example, these channels can be multiplexed to DAC 774 and then demultiplexed to mixer 760, mixer 758, mixer 756 and mixer 754.

The output of DAC 774 is analog signal 722, analog signal 724, analog signal 726 and analog signal 728.

Local analog oscillator signal 762 is split by splitter 764 into four signals, split analog oscillator signal 710 at frequency $f_{LO}$, split oscillator signal 708 at frequency $f_{LO}+\Delta f$, split oscillator signal 706 at frequency $f_{LO}+2\Delta f$, and split analog oscillator signal 704 at frequency $f_{LO}+3\Delta f$.

Since each analog signal is at a distinct modulating frequency, they must be up-converted before amplification to restore the original RF frequency for transmission. For example, analog signal 722 is input to the IF port of mixer 760 and split oscillator signal 710 is input to the LO port. Mixed analog signal 746 will then be restored to RF frequency, $f_{RF}$, where:

$$f_{RF} = |f_{LO} - f_1|. \quad (5)$$

and where $f_{LO}$ is the frequency of local analog oscillator signal 762. Similarly, mixed analog signal 748 will be restored according to $f_{RF}$, where:

$$f_{RF} = |(f_{LO}+\Delta f) - F_2|. \quad (6)$$

mixed analog signal 750 will be restored according to $f_{RF}$, where:

$$f_{RF} = |(f_{LO}+2\Delta f) - F_3| \quad (7)$$

and mixed analog signal 752 will be restored according to $f_{RF}$, where:

$$f_{RF} = |(f_{LO}+3\Delta f) - F_4|. \quad (8)$$

Once the analog signals are up-converted to RF frequency, each mixed signal is amplified at an HPA and transmitted by the associated antenna array element. Mixed analog signal 746 is amplified at HPA 730 and RF signal 766 is transmitted by antenna element 738. Mixed analog signal 748 is amplified at HPA 732 and RF signal 768 is transmitted by antenna element 740. Mixed analog signal 750 is amplified at HPA 734 and RF signal 770 is transmitted by antenna element 742. Mixed analog signal 752 is amplified at HPA 736 and RF signal 772 is transmitted by antenna element 744.

In summary, phased array beamforming antennas are desirable because the antenna beam can be steered electronically and with extreme agility. Phased array antennas can be implemented in either the analog/RF or digital domain. In the traditional analog/RF implementation, phase shifters or time-delay elements are used to introduce an incremental phase offset for each channel of the PAA. Although this is a feasible method and integrated solutions can be implemented, the complexity of the analog/RF circuitry is high. Microwave modeling of the phase shifter, frequency modulators/demodulators and amplifiers are critical to the performance of the PAA. Obtaining high performance in the analog/RF domain is not an easy task.

For this reason, digital methods are preferred. Each RF/analog channel signal is down-converted to an IF because analog to digital converters have limited sampling rates and often times cannot sample up to RF/microwave frequencies. Once the channel signals are down-converted to a low-IF, they are each converted to a digital signal and a DSP algorithm is utilized to form the beam. Digital beamforming (DBF) relies on the fact that each channel can be distinguished from the other. For this reason, in the prior art, each channel is physically isolated from the others and therefore it is necessary for each channel to have a single ADC behind it. The disadvantage of this method is that it requires a large physical area in addition to high power consumption.

In a present embodiment of the invention, frequency division multiplexing (FDM) is used to offer a distinguishing factor for each channel so that one ADC supports a plurality of antenna elements in a DBF antenna array. A combined digital signal from the ADC can then be down-sampled by polyphase filtering and the signal spectrum channelized by an inverse fast Fourier transform (IFFT). This reduces the overall cost, weight, size and consumed power of the required circuitry. In addition, polyphase filtering of the combined digital signal from the single ADC can be used to save processing resources.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A system comprising:
a first low noise amplifier configured to output a first amplified analog signal based on a received analog antenna signal at a time $t_0$;
a second low noise amplifier configured to output a second amplified analog signal based on the received analog antenna signal at a time $t_1$;
a local oscillator configured to output a local analog oscillator signal;
a signal splitter configured to output a first split analog oscillator signal and a second split analog oscillator signal, the first split analog oscillator signal being based on the local analog oscillator signal, the second split analog oscillator signal being based on the local analog oscillator signal and being different from the first split analog oscillator signal;
a first mixer configured to output a first mixed signal based on the first amplified analog signal and the first split analog oscillator signal;
a second mixer configured to output a second mixed signal based on the second amplified analog signal and the second split analog oscillator signal;
an analog to digital converter configured to output a combined digital signal based on the first mixed signal and the second mixed signal; and
a digital channelizer and beam-former configured to output a received signal based on the combined digital signal;
wherein said digital channelizer and beam-former comprises:
a polyphase filter configured to receive the combined digital signal, to output a first filtered signal having a first frequency and to output a second filtered signal having a second frequency; and
a time division multiplexer configured to output beam-formed received signal based on the first filtered signal and the second filtered signal.

2. The system of claim 1, wherein said digital channelizer and beam-former further comprises an inverse fast Fourier transform component coupled between the polyphaser filter and the time division multiplexer.

3. A method comprising:
outputting, via a first low noise amplifier, a first amplified analog signal based on a first received analog driving signal;
outputting, via a second low noise amplifier, a second amplified analog signal based on a second received analog driving signal;
outputting, via a local oscillator, a local analog oscillator signal;
outputting, via a signal splitter, a first split analog oscillator signal and a second split analog oscillator signal, the first split analog oscillator signal being based on the local analog oscillator signal, the second split analog oscillator signal being based on the local analog oscillator signal and being different from the first split analog oscillator signal;
outputting, via a first mixer, a first mixed signal based on the first amplified analog signal and the first split analog oscillator signal;
outputting, via a second mixer, a second mixed signal based on the second amplified analog signal and the second split analog oscillator signal;
outputting, via an analog to digital converter, a combined digital signal based on the first mixed signal and the second mixed signal; and
outputting, via a digital channelizer and beam-former, a driving signal based on the combined digital signal;
wherein said outputting, via the digital channelizer and beam-former, the driving signal based on the combined digital signal comprises:

receiving, via a polyphase filter, the combined digital signal;

outputting, via the polyphase filter, a first filtered signal having a first frequency;

outputting, via the polyphase filter, a second filtered signal having a second frequency;

outputting, via an inverse Fourier transform component, a first transformed signal based on the first filtered signal;

outputting, via the inverse Fourier transform component, a second transformed signal based on the second filtered signal; and outputting, via a time division multiplexer, a received signal based on the first transformed signal and the second transformed signal.

4. The method of claim 3, wherein said outputting, via the inverse Fourier transform component, the second transformed signal based on the second filtered signal comprises outputting the second transformed signal via an inverse fast Fourier transform component.

* * * * *